(12) United States Patent
Liou et al.

(10) Patent No.: US 8,372,692 B2
(45) Date of Patent: Feb. 12, 2013

(54) METHOD OF STACKING FLIP-CHIP ON WIRE-BONDED CHIP

(75) Inventors: Shiann-Ming Liou, Campbell, CA (US); Albert Wu, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 106 days.

(21) Appl. No.: 13/004,397

(22) Filed: Jan. 11, 2011

(65) Prior Publication Data

US 2011/0180913 A1 Jul. 28, 2011

Related U.S. Application Data

(60) Provisional application No. 61/298,843, filed on Jan. 27, 2010.

(51) Int. Cl.
*H01L 21/00* (2006.01)
*H01L 23/52* (2006.01)
*H01L 29/40* (2006.01)

(52) U.S. Cl. ........ 438/108; 257/686; 257/778; 257/777; 438/109

(58) Field of Classification Search .................. 257/784, 257/686, 777, 778; 438/107, 108, 109, 110
See application file for complete search history.

(56) References Cited

U.S. PATENT DOCUMENTS

| | | | | |
|---|---|---|---|---|
| 7,880,310 B2 * | 2/2011 | Mathew | .................. | 257/777 |
| 2005/0001303 A1 * | 1/2005 | Fang | .................. | 257/686 |
| 2005/0224959 A1 * | 10/2005 | Kwon et al. | .................. | 257/723 |
| 2006/0197211 A1 * | 9/2006 | Miyata et al. | .................. | 257/686 |
| 2007/0152317 A1 * | 7/2007 | Shen | .................. | 257/686 |
| 2007/0210434 A1 * | 9/2007 | Hsin | .................. | 257/686 |
| 2007/0228543 A1 * | 10/2007 | Walter et al. | .................. | 257/686 |
| 2009/0200652 A1 * | 8/2009 | Oh et al. | .................. | 257/686 |
| 2010/0025833 A1 * | 2/2010 | Pagaila et al. | .................. | 257/686 |
| 2011/0062574 A1 * | 3/2011 | Jang et al. | .................. | 257/686 |
| 2011/0186978 A1 * | 8/2011 | Kim et al. | .................. | 257/686 |
| 2011/0241194 A1 * | 10/2011 | Chen et al. | .................. | 257/686 |

* cited by examiner

*Primary Examiner* — S. V Clark

(57) ABSTRACT

Some of the embodiments of the present disclosure provide apparatuses, systems, and methods for stacking chips. A first chip may be mounted on a substrate, wherein an active surface of the first chip faces away from the substrate, and wherein the first chip includes a plurality of bump pads located on the active surface of the first chip, and a wire may bond a first bump pad of the plurality of bump pads to the substrate. An intermediate layer may be disposed on at least a portion of the active surface of the first chip, and a via within the intermediate layer may extend to a second bump pad of the plurality of bump pads. A second chip may be disposed on the intermediate layer, wherein an active surface of the second chip faces towards the substrate, and wherein the second chip includes a third bump pad (i) located on the active surface of the second chip and (ii) aligned with the via formed in the intermediate layer. A corresponding bump may be disposed on one or more of (i) the second bump pad located on the active surface of the first chip and (ii) the third bump pad located on the active surface of the second chip, and within the via, wherein the corresponding bump electrically connects the second bump pad with the third bump pad. Other embodiments are also described and claimed.

16 Claims, 16 Drawing Sheets

METHOD OF STACKING FLIP-CHIP ON WIRE-BONDED CHIP

CROSS-REFERENCE TO RELATED APPLICATIONS

The present application claims priority to U.S. Provisional Patent Application No. 61/298,843, filed Jan. 27, 2010, the entire disclosure of which is hereby incorporated by reference in its entirety for all purposes except for those sections, if any, that are inconsistent with this specification.

TECHNICAL FIELD

Embodiments of the present disclosure relate to the field of integrated circuits, and more particularly, to techniques, structures, and configurations for stacking a flip-chip on top of a wire-bonded chip.

BACKGROUND

Semiconductor packages can include more than one die. The multiple dies of a single package may be arranged in any one of a number of configurations. In some packages, for example, the dies may be stacked. When one of the dies is wire-bonded to a substrate with an additional die stacked over the wire-bonded die, the additional die must avoid contacting the wires of the wire-bonded die to avoid damage.

SUMMARY

The present disclosure also provides a method of fabricating a semiconductor package, the method comprising mounting a first chip onto a substrate, wherein an active surface of the first chip faces away from the substrate, and wherein the first chip includes a plurality of bump pads located on the active surface of the first chip. A wire may be bonded from a first bump pad of the plurality of bump pads to the substrate. The method may further comprise forming an intermediate layer on at least a portion of the active surface of the first chip, and forming a via in the intermediate layer, wherein the via extends to a second bump pad of the plurality of bump pads. A second chip may be placed on the intermediate layer, wherein an active surface of the second chip faces towards the substrate, and wherein the second chip includes a third bump pad (i) located on the active surface of the second chip and (ii) aligned with the via formed in the intermediate layer. A corresponding bump may be formed on one or more of (i) the second bump pad located on the active surface of the first chip and (ii) the third bump pad located on the active surface of the second chip, and the corresponding bump may be heated to melt the corresponding bump within the via and thereby form an electrical connection between the second bump pad and the third bump pad.

The present disclosure also provides a semiconductor package comprising a substrate, and a first chip mounted on the substrate, wherein an active surface of the first chip faces away from the substrate, and wherein the first chip includes a plurality of bump pads located on the active surface of the first chip. The package may further comprise a wire bonding a first bump pad of the plurality of bump pads to the substrate. An intermediate layer may be disposed on at least a portion of the active surface of the first chip, and a via in the intermediate layer, wherein the via extends to a second bump pad of the plurality of bump pads. The package may further comprise a second chip disposed on the intermediate layer, wherein an active surface of the second chip faces towards the substrate, and wherein the second chip includes a third bump pad (i) located on the active surface of the second chip and (ii) aligned with the via formed in the intermediate layer. A corresponding bump may be formed on one or more of (i) the second bump pad located on the active surface of the first chip and (ii) the third bump pad located on the active surface of the second chip, and within the via, wherein the corresponding bump electrically connects the second bump pad with the third bump pad.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

Figure 1:
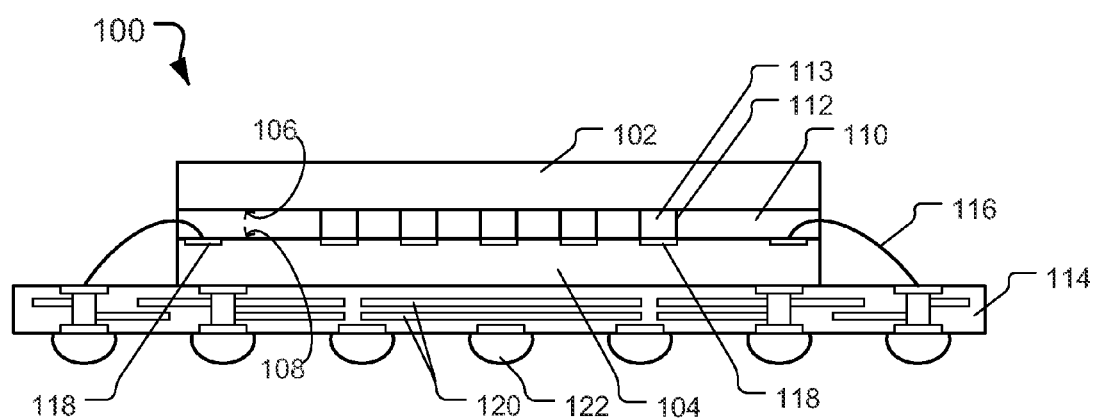
FIGS. 1-9 schematically illustrate a semiconductor package subsequent to various process operations of stacking a flip chip onto a wire-bonded chip.

Embodiments of the present invention provide a flip-chip stacked on top of a wire-bonded chip. The terms chip, die, integrated circuit, monolithic device, semiconductor device, and microelectronic device are often used interchangeably in the microelectronics field. The present invention is applicable to all of the above as they are generally understood in the field.

FIGS. 1-9 schematically illustrate a semiconductor package 100 subsequent to various process operations for stacking a second chip 102 (e.g., a flip-chip) onto a first chip 104 (e.g., a wire-bonded chip). In one implementation, an active surface 106 of the second chip 102 faces an active surface 108 of the first chip 104. The term "active surface" refers to the surface of a chip having the active regions/areas, as is known to those having skill in the art. The active surface of a chip may include any one or more of various circuitry components, such as transistors, memory cells, passive components, and the like. An intermediate layer 110 is disposed between the second chip 102 and the first chip 104. The intermediate layer 110 includes one or more vias 112 filled with an interconnect material 113 contacting and electrically coupling one or more portions of the active surface 106 of the second chip 102 and one or more portions of the active surface 108 of the first chip 104.

Figure 2:
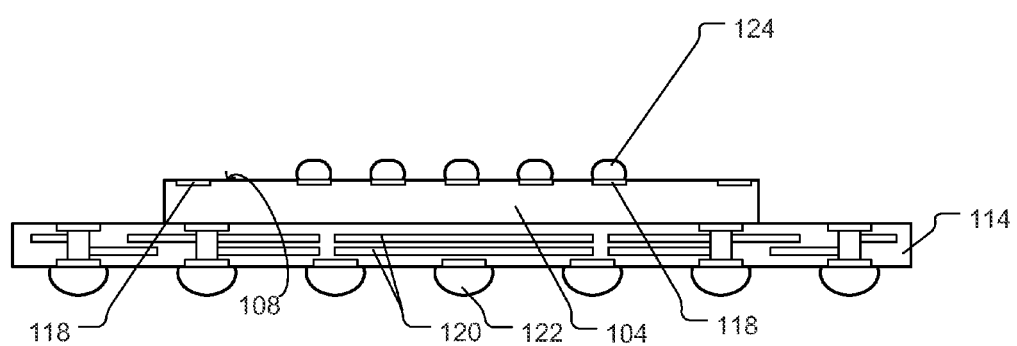

To construct the semiconductor package 100, a first chip 104 may be mounted to a substrate 114, as illustrated in FIG. 2. The active surface 108 of the first chip 104 is mounted to face away from the substrate 114. The substrate 114 may comprise any suitable substrate for carrying the stacked chips 102, 104. In various embodiments, for example, the substrate 114 comprises a carrier substrate or a leadframe. A carrier substrate may include one or more metallization layers 120 for carrying electrical signals, and may include one or more solder bumps 122 to provide an electrical connection between the semiconductor package 100 and an electronic device such as, for example, a motherboard or other circuit board, that is external to the semiconductor package 100. The one or more solder bumps 122 may be used to route the electrical signals, such as the I/O and/or power/ground signals for the wire-bonded chip 104 and/or the second chip 102, to or from the semiconductor package 100.

The first chip 104 includes one or more bumps 124 coupled to corresponding bump pads 118 located on the active surface 108. The bumps 124 may be formed on the bump pads 118 prior to the first chip 104 being mounted to the substrate 114. In these embodiments, the bumps 124 are formed on the bump pads 118 prior to or after the first chip 104 is singulated from a wafer (i.e., at wafer-level or die-level). In other embodiments, the bumps 124 are formed on the bump pads 118 after the first chip 104 is mounted to the substrate 114. Although five bumps 124 are depicted, more or fewer bumps can be used in other embodiments.

The bumps 124 comprise structures formed of an electrically conductive material such as metal, solder, or alloy, and can include a variety of shapes and configurations. For example, the bumps 124 may be spherical or semi-spherical, as depicted, or include other shapes such as polygons, cylinders, or the like. The bumps 124 may be formed using a bumping process, such as, for example, a controlled collapse chip connect (C4) process, stud-bumping, or other suitable bumping process. The bumps 124 may provide an electrical connection or part of an electrical connection between the first chip 104 and the second 102.

Figure 3:
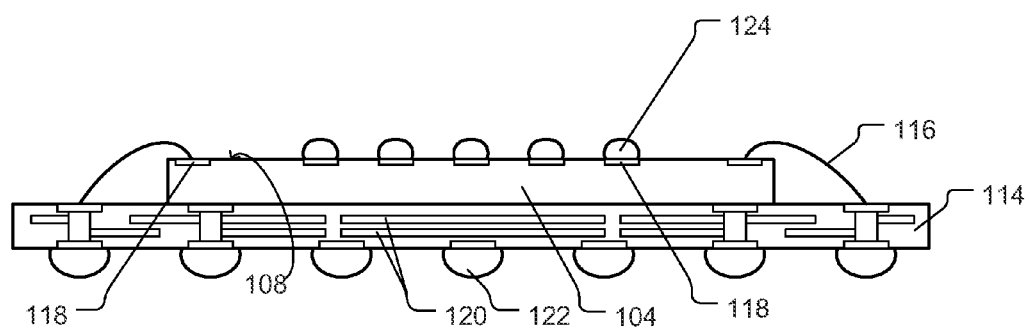

The first chip 104 is wire-bonded to the substrate 114, as illustrated in FIG. 3. Wires 116 are bonded to one or more bump pads 118 of the first chip 104 and then coupled to the substrate 114. The wires 116 may comprise an electrically conductive material, such as a metal, to route electrical signals such as, for example, input/output (I/O) or power/ground signals to or from the first chip 104. The wires 116 may be formed using, for example, a ball-bonding or wedge-bonding process.

Figure 4:
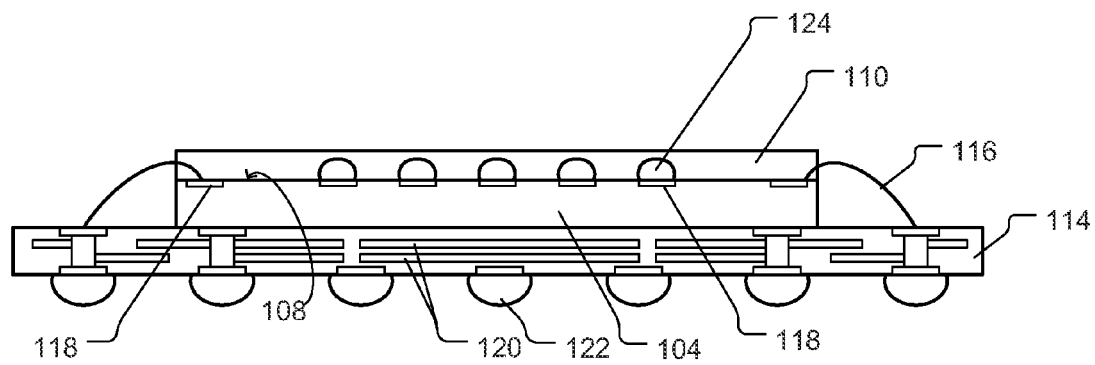
Figure 6:
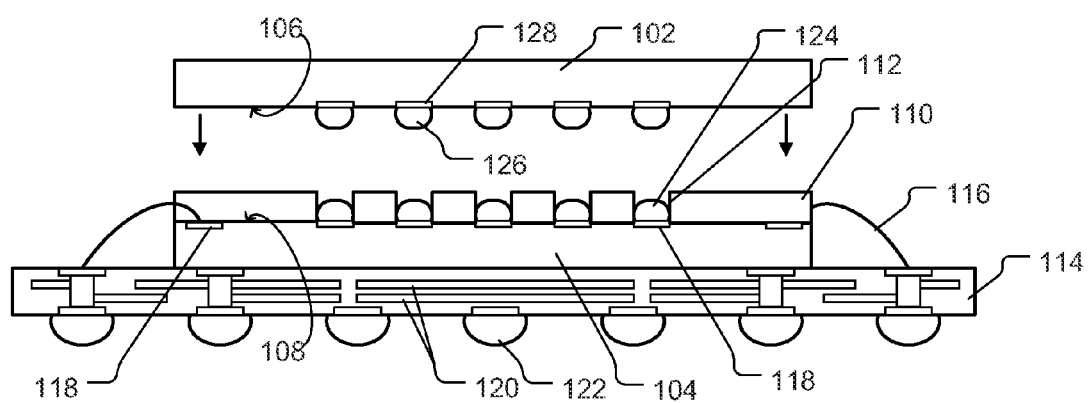

The intermediate layer 110 is formed on the first chip 104, as illustrated in FIG. 4. In one embodiment, the intermediate layer 110 is configured to provide a predetermined offset (distance) between the second chip 102 and the first chip 104 so as to keep the second chip 102 from touching the wires 116. This predetermined offset can prevent direct coupling of the second chip 102 to the first chip 104 via the wires 116 in cases in which the second chip 102 has a size that is substantially equal to (or greater than) a size of the first chip 104. For example, when the second chip 102 has a width that is similar to or larger than a width of the first chip 104 (as shown in FIG. 6), the wires 116 may potentially be damaged if the second chip 102 were to be mounted to the first chip 104 without a predetermined offset being between the two chips.

In addition to providing a predetermined offset between the second chip 102 and the first chip 104, the intermediate layer 110 may provide one or more of protection of the wire-bonds, heat dissipation, or increased bonding strength between the second chip 102 and the first chip 104 (as compared to using only bumps to mount the second chip 102 onto the first chip 104).

The intermediate layer 110 comprises any material suitable for the described purpose(s). The intermediate layer 110 may comprise, for example, a paste, a glue, an adhesive, or the like, and may be applied in accordance with the properties of the selected material. For instance, in embodiments in which the intermediate layer 110 is a paste, the intermediate layer may be molded or poured onto the active surface 108 of the wire-bonded chip 104. In various other embodiments, the intermediate layer 110 comprises silicon, glass, or an organic substrate, as described more fully below.

The intermediate layer 110 is configured to cover one or more of the bump pads 118 having the wires 116 bonded thereto, as illustrated. This configuration may be particularly suitable for embodiments in which protection of the wire-bonds is desired. In other embodiments, the intermediate layer 110 may instead be formed such that the intermediate layer 110 does not contact the wire-bonds at the bump pads 118. In other words, the intermediate layer 110 may have a width that is smaller than the distance between bump pads 118 on opposing sides of the first chip 104.

Figure 5:
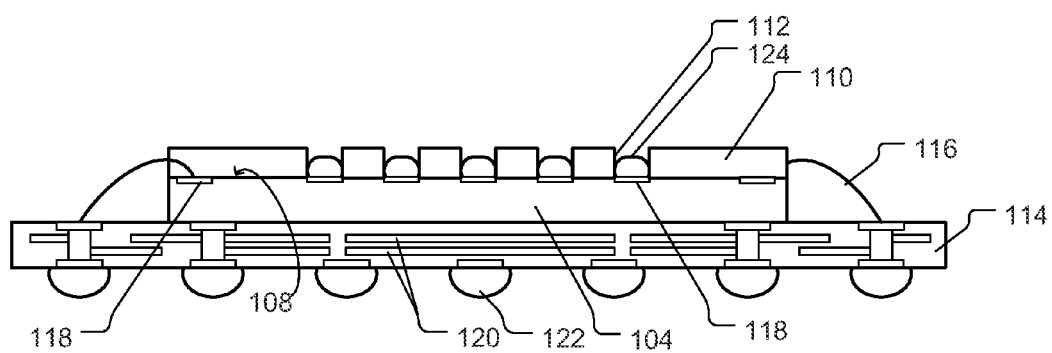

The vias 112 are formed in the intermediate layer 110, as illustrated in FIG. 5. The vias 112 may be configured to extend to the bumps 124 of the first chip 104 so as to expose the bumps 124. In various embodiments, the vias 112 may be formed by laser-drilling or etching or any other suitable method. In some embodiments, the vias 112 may be formed in the intermediate layer 110 prior to providing the intermediate layer 110 on the active surface 108 of the first chip 104. In one embodiment in which bumps 124 are not formed on the bump pads 118 (as discussed in greater detail below), the vias 112 are formed to extend to one or more bump pads 118.

Figure 7:
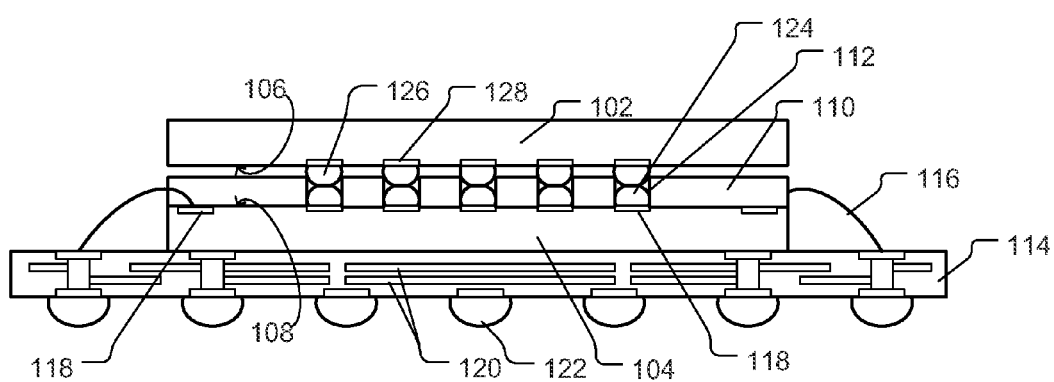

The second chip 102 is placed onto the intermediate layer 110, as illustrated in FIGS. 6 and 7. In one embodiment, the second chip 102 includes one or more bumps 126 coupled to corresponding bump pads 128 on the active surface 106 of the second chip 102. The second chip 102 may be placed onto the intermediate layer 110 such that the bumps 126 (or bump pads 128) align with the vias 112.

As with the bumps 124 on the first chip 104, the bumps 126 comprise structures formed of an electrically conductive material such as metal, solder, or alloy, and can include a variety of shapes and configurations. For example, the bumps 126 may be spherical or semi-spherical, as depicted, or include other shapes such as polygons, cylinders, or the like. The bumps 126 may be formed using a bumping process, such as, for example, a controlled collapse chip connect (C4) process, stud-bumping, or other suitable bumping process. In one embodiment, the bumps 126 provide an electrical connection (or part of an electrical connection) between the first chip 104 and the second chip 102.

The bumps 126 of the second chip 102 and the bumps 124 of the first chip 104 may be coupled by heating the bumps 124, 126 to cause the bumps 124, 126 to reflow (or melt), thereby forming an electrical connection between the second chip 102 and the first chip 104, and the semiconductor package 100 as illustrated in FIG. 1.

Figure 8:
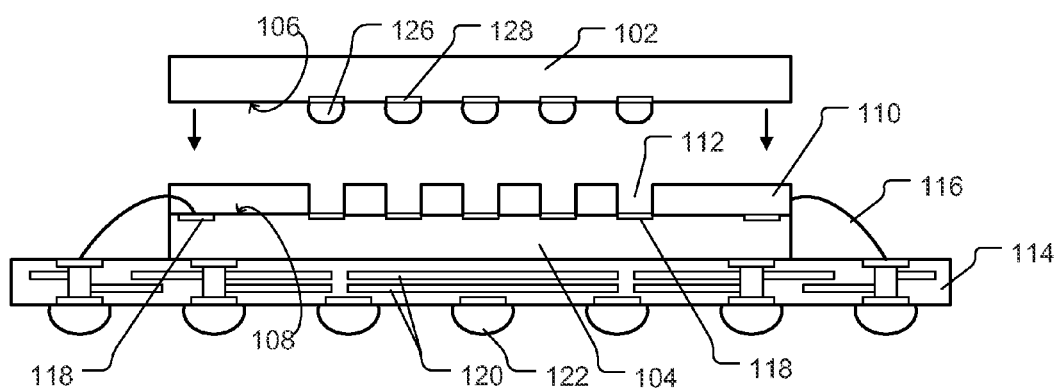
Figure 9:
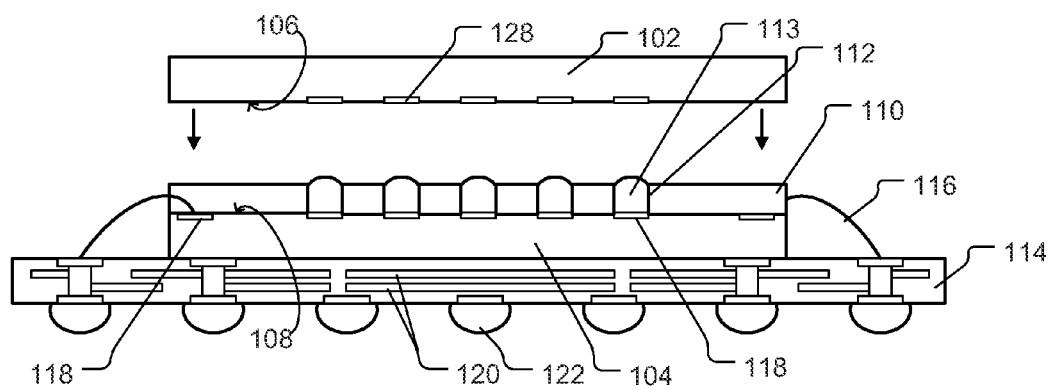

In various embodiments, rather than including bumps 124, 126 on both the first chip 104 and the second chip 102, respectively, bumps may instead be provided only on one of the first chip 104 or the second chip 102. As illustrated in FIG. 8, for example, bumps 126 may be provided only on the second chip 102, or as illustrated in FIG. 9, bumps 124 may be provided only on the second chip 104. Whether the bumps are provided on the second chip 102 or the first chip 104, the bumps may need to be formed of a size to provide sufficient interconnect material to fill the vias 112 with few or no voids. In FIG. 9, for example, the bumps 124 have a height that is greater than a height of the intermediate layer 110.

As noted herein, the intermediate layer 110 may comprise silicon, glass, or an organic substrate. The silicon, glass, or an organic substrate may be a preformed structure, or may be formed in situ on the first chip 104. FIGS. 10-15 schematically illustrate a semiconductor package 200 subsequent to various process operations for stacking a second chip 102 (e.g., a flip-chip) onto a first chip 102 (e.g., a wire-bonded chip), wherein the intermediate layer 210 comprises silicon, glass, or an organic substrate. For clarity and to avoid redundancy, elements that are similar to the elements discussed herein with respect to FIGS. 1-9 are noted using the same reference numerals.

Figure 11:
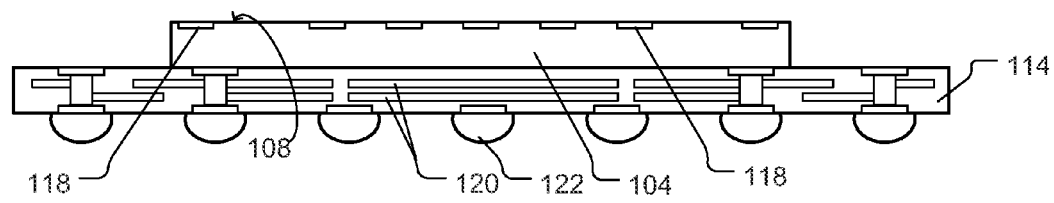
Figure 12:
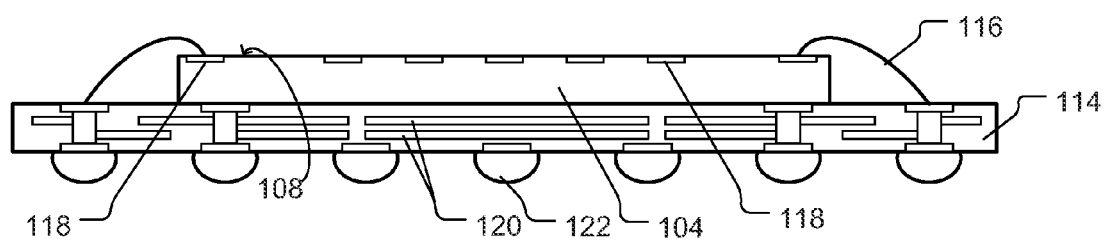

To construct the semiconductor package 200, the first chip 104 is mounted to a substrate 114, as illustrated in FIG. 11, and then wire-bonded to the substrate 114, as illustrated in FIG. 12.

Figure 13:
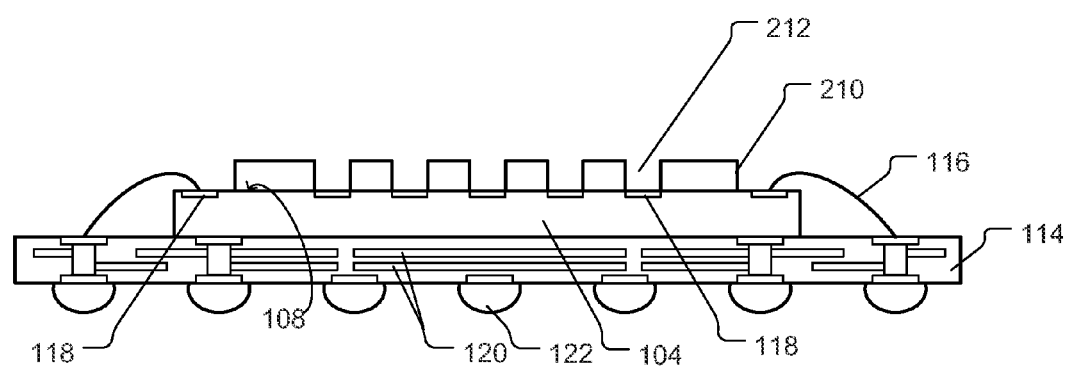

The intermediate layer 210 is then formed on the first chip 104, as illustrated in FIG. 13. In some embodiments, the intermediate layer 210 may instead be formed on the first chip 104 prior to the wire-bonding. As with the intermediate layer 110 discussed earlier, in one implementation, the intermediate layer 210 is configured to provide a predetermined offset between the second chip 102 and the first chip 104 so as to keep the second chip 102 from touching the wires 116. The predetermined offset may be particularly important when the second chip 102 is wide enough to prevent direct coupling of the second chip 102 to the first chip 104 due the coupling of the wires 116 to the first chip 102. For example, when the second chip 102 has a width that is similar to or larger than a width of the first chip 104, the wires 116 may potentially be damaged if the second chip 102 were to be mounted to the first chip 104 without the predetermined offset.

In addition to providing a predetermined offset between the second chip 102 and the first chip 104, the intermediate layer 210 may provide heat dissipation and/or increased bonding strength between the second chip 102 and the first chip 104 (as compared to mounting the second chip 102 onto the first chip 104 using the bumps 124 alone).

The intermediate layer 210 includes one or more vias 212. The vias 212 may be configured to provide openings for filling with an interconnect material for coupling the active surface 106 of the second chip 102 to the active surface 108 of the first chip 104. In some embodiments, although not illustrated, the vias 212 may be configured to extend to bumps (similar to bumps 124 discussed earlier) on the first chip 104. In various embodiments, the vias 212 may be formed by laser-drilling or etching or any other suitable method. In some embodiments, the vias 212 may be formed in the intermediate layer 210 prior to providing the intermediate layer 210 on the active surface 108 of the first chip 104.

Figure 14:
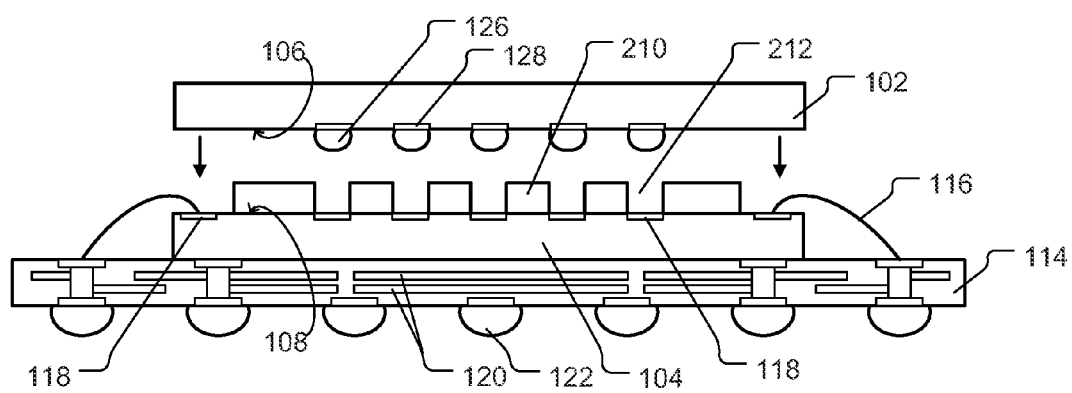
Figure 15:
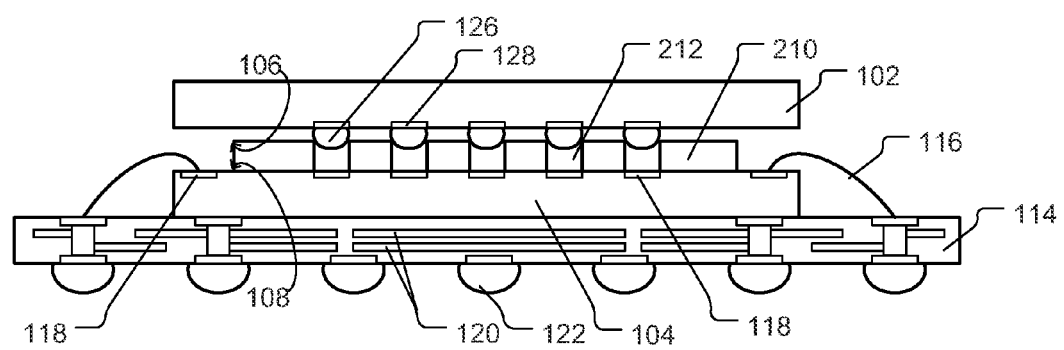

The second chip 102 is then placed onto the intermediate layer 110, as illustrated in FIGS. 14 and 15. The second chip 102 includes one or more bumps 126 coupled to corresponding one or more bump pads 128 on the active surface 106 of the second chip 102. The second chip 102 may be placed onto the intermediate layer 110 such that the bumps 126 align with the vias 212.

Figure 10:
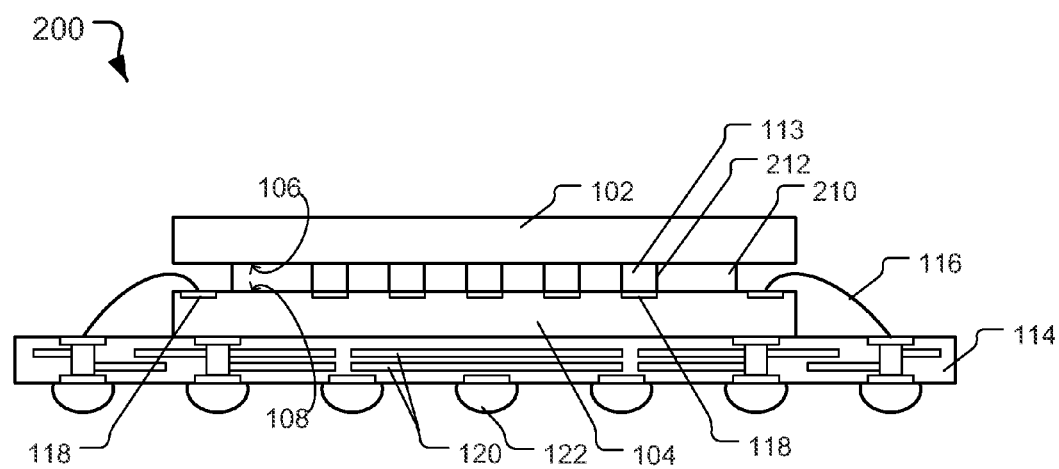
FIGS. 10-15 schematically illustrate another semiconductor package subsequent to various process operations of stacking a flip chip onto a wire-bonded chip.

The bumps 126 of the second chip 102 may be coupled to bump pads 118 on the active surface 108 of the first chip 104 by heating the bumps 126 to cause the bumps 126 to reflow, thereby forming an electrical connection between the second chip 102 and the first chip 104, and the semiconductor package 100 as illustrated in FIG. 10.

In various embodiments, rather than including bumps 126 on the second chip 102, bumps (similar to bumps 124 discussed herein) may be provided on the first chip 104, in addition to or instead of the bumps 126 on the second chip 102. Whether the bumps are provided on the second chip 102 or the first chip 104, the bumps may need to be formed of a size to provide sufficient interconnect material to fill the vias 212 with few or no voids.

Figure 16:
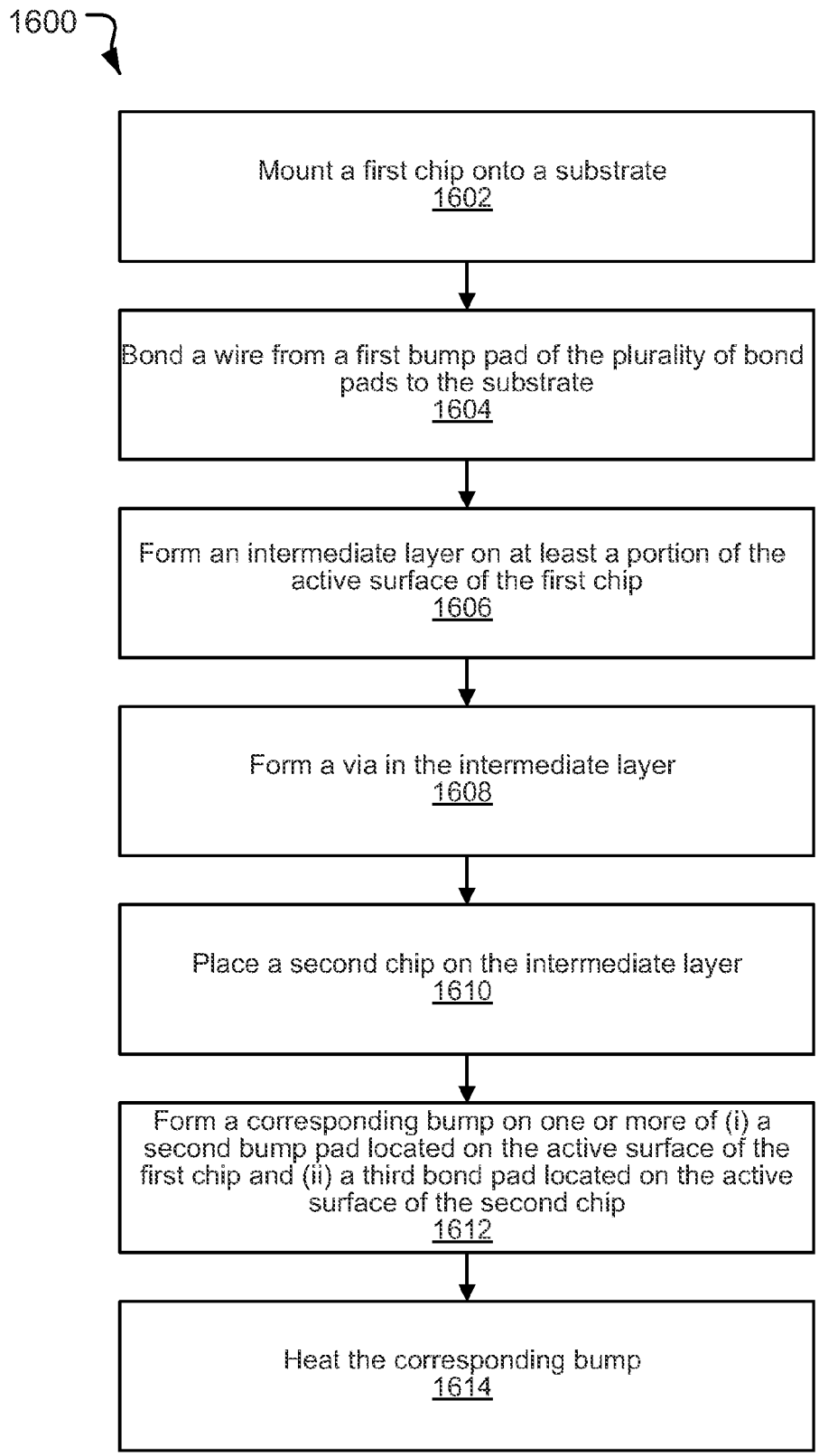
FIG. 16 is a process flow diagram of a method to fabricate a semiconductor package including a flip chip stacked onto a wire-bonded chip.

FIG. 16 is a flow diagram of some of the operations associated with an example method 1600 of fabricating a semiconductor package (e.g., the semiconductor packages 100 or 200 of respective FIGS. 1 and 10) including stacking a second chip 102 (e.g., a flip-chip) onto a first chip 104 (e.g., (e.g., a wire-bonded chip), in accordance with various embodiments described herein. It should be noted that although the method 1600 is illustrated as a series of sequential steps, the method is not necessarily order dependent. Moreover, methods within the scope of this disclosure may include more or fewer steps than those illustrated in FIG. 16. The method 1600 may comport with techniques and configurations described in connection with FIGS. 1-15.

The method 1600 may include one or more functions, operations, or actions as is illustrated by block 1602, block 1604 block 1606 block 1608, and/or block 1610. Processing for the method 1600 may start with block 1602 by mounting a first chip onto a substrate, wherein an active surface of the first chip faces away from the substrate, and wherein the first chip includes a plurality of bump pads located on the active surface of the first chip. The first chip may comprise a chip similar to the first chip 104 described herein. The substrate may comprise a substrate similar to the substrate 114 described herein.

At block 1604, a wire are bonded from a first bump pad of the plurality of bump pads to the substrate. The wires may be similar to the wires 116 described herein, while the bump pads may be similar to the bump pads 118 described herein.

A block 1606, an intermediate layer is formed on at least a portion of the active surface of the first chip. The intermediate layer may comprise a paste, a glue, an adhesive, or the like, or may comprise glass, silicon, or an organic substrate. The intermediate layer may be similar to one or intermediate layers 110, 210 described herein.

At block 1608, a via is formed in the intermediate layer, wherein the via extends to a second bump pad of the plurality of bump pads. The via may be formed in the intermediate layer before providing the intermediate layer onto the first chip, or may instead be formed after the intermediate layer is provided onto the first chip. The via may be formed by any suitable method including etching, laser drilling, or the like.

At block 1610, a second chip is placed on the intermediate layer, wherein an active surface of the second chip faces towards the substrate, and wherein the second chip includes a third bump pad (i) located on the active surface of the second chip and (ii) aligned with the via formed in the intermediate layer.

At block 1612, a corresponding bump is formed on one or more of (i) the second bump pad located on the active surface of the first chip and (ii) the third bump pad located on the active surface of the second chip.

At block 1614, the corresponding bump formed on the one or more of (i) the second bump pad located on the active surface of the first chip and (ii) the third bump pad located on the active surface of the second chip is heated to melt the corresponding bump within the via and thereby form an electrical connection between the second bump pad and the third bump pad. The corresponding bumps may be similar to the bumps 124, described herein, coupled to corresponding one or more bump pads on the active surface.

Although not illustrated, in various embodiments the method 1600 may further comprise forming a molding compound to encapsulate at least the first die, the intermediate layer, and the second die to form a semiconductor package (e.g., semiconductor package 100 or 200). The molding compound can be formed according to any suitable molding compound technique, including, for example, depositing a resin in powder form into a mold and applying heat to melt/fuse the resin. Other suitable techniques can be used in other embodiments.

Various operations may be described as multiple discrete operations in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," or "in various embodiments," which may each refer to one or more of the same or different embodiments. Furthermore, the terms "comprising," "including," "having," and the like, as used with respect to embodiments of the present invention, are synonymous.

For purposes of this description, the phrase "A/B" means A or B. The phrase "A and/or B" means "(A), (B), or (A and B)." The phrase "at least one of A, B, and C" means "(A), (B), (C), (A and B), (A and C), (B and C), or (A, B, and C)." The phrase "(A)B" means "(B) or (AB)," that is, A is an optional element.

Although certain embodiments have been illustrated and described herein for purposes of description of a preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A method of fabricating a semiconductor package, the method comprising:
   mounting a first chip onto a substrate, wherein an active surface of the first chip faces away from the substrate, and wherein the first chip includes a plurality of bump pads located on the active surface of the first chip;
   bonding a wire from a first bump pad of the plurality of bump pads to the substrate;
   forming an intermediate layer on at least a portion of the active surface of the first chip;
   forming a via in the intermediate layer, wherein the via extends to a second bump pad of the plurality of bump pads;
   placing a second chip on the intermediate layer, wherein an active surface of the second chip faces towards the substrate, and wherein the second chip includes a third bump pad (i) located on the active surface of the second chip and (ii) aligned with the via formed in the intermediate layer;
   forming a corresponding bump on one or more of (i) the second bump pad located on the active surface of the first chip and (ii) the third bump pad located on the active surface of the second chip, wherein the corresponding bump is formed on the second bump pad located on the active surface of the first chip, and wherein a height of the corresponding bump is greater than a height of the intermediate layer; and
   heating the corresponding bump formed on the one or more of (i) the second bump pad located on the active surface of the first chip and (ii) the third bump pad located on the active surface of the second chip to melt the corresponding bump within the via and thereby form an electrical connection between the second bump pad and the third bump pad.

2. The method of claim 1, wherein the bump is formed on the second bump pad prior to the first chip being mounted to the substrate.

3. The method of claim 2, wherein the forming the intermediate layer comprises covering the first bump pad with the intermediate layer.

4. The method of claim 1, wherein the forming the via comprises forming the via in the intermediate layer correspondingly extending to the corresponding bump.

5. The method of claim 1, wherein the forming the corresponding bump comprises forming the corresponding bump on the third bump pad on the active surface of the second chip.

6. The method of claim 5, wherein heating the corresponding bump comprises coupling the corresponding bump to the second bump pad on the active surface of the first chip.

7. The method of claim 6, wherein the coupling the corresponding second bump to the second bump pad comprises reflowing the corresponding bump.

8. The method of claim 1, wherein the intermediate layer comprises a paste, a glue, or an adhesive.

9. The method of claim 1, wherein the intermediate layer comprises silicon, glass, or an organic substrate.

10. The method of claim 1, wherein the forming the via is performed before forming the intermediate layer on the at least a portion of the active surface.

11. The method of claim 1, wherein the forming the via comprises laser-etching the via in the intermediate layer.

12. A semiconductor package comprising:
   a substrate;
   a first chip mounted on the substrate, wherein an active surface of the first chip faces away from the substrate, and wherein the first chip includes a plurality of bump pads located on the active surface of the first chip;
   a wire bonding a first bump pad of the plurality of bump pads to the substrate;
   an intermediate layer disposed on at least a portion of the active surface of the first chip;
   a via in the intermediate layer, wherein the via extends to a second bump pad of the plurality of bump pads;
   a second chip disposed on the intermediate layer, wherein an active surface of the second chip faces towards the substrate, and wherein the second chip includes a third bump pad (i) located on the active surface of the second chip and (ii) aligned with the via formed in the intermediate layer;
   a corresponding bump on one or more of (i) the second bump pad located on the active surface of the first chip and (ii) the third bump pad located on the active surface of the second chip, and within the via, wherein the corresponding bump electrically connects the second bump pad with the third bump pad, wherein the corresponding bump is located on the second bump pad located on the active surface of the first chip, and wherein a height of the corresponding bump is greater than a height of the intermediate layer.

13. The semiconductor package of claim 12, wherein the substrate is a leadframe.

14. The semiconductor package of claim 12, wherein the intermediate layer covers the first bump pad.

15. The semiconductor package of claim 12, wherein the intermediate layer comprises a paste, a glue, or an adhesive.

16. The semiconductor package of claim 12, wherein the intermediate layer comprises silicon, glass, or an organic substrate.

* * * * *